United States Patent
Huang et al.

(12) 
(10) Patent No.: US 7,715,164 B2
(45) Date of Patent: May 11, 2010

(54) EMBEDDED TYPE MULTIFUNCTIONAL INTEGRATED STRUCTURE AND METHOD FOR MANUFACTURING THE SAME

(75) Inventors: Chien-Hao Huang, Taipei (TW); Wen-Chih Li, Shueishang Township, Chiayi County (TW)

(73) Assignee: Inpaq Technology Co., Ltd., Hsinchu (TW)

( * ) Notice: Subject to any disclaimer, the term of this patent is extended or adjusted under 35 U.S.C. 154(b) by 349 days.

(21) Appl. No.: 11/984,559

(22) Filed: Nov. 20, 2007

(65) Prior Publication Data

US 2009/0130369 A1 May 21, 2009

(51) Int. Cl.
*H02H 5/04* (2006.01)

(52) U.S. Cl. ........................................ 361/106
(58) Field of Classification Search ............... 361/106
See application file for complete search history.

(56) References Cited

U.S. PATENT DOCUMENTS

| | | | |
|---|---|---|---|
| 6,809,626 B2 * | 10/2004 | Chu et al. ............... | 337/167 |
| 6,873,244 B2 * | 3/2005 | Huang et al. ............ | 338/22 R |
| 7,119,655 B2 * | 10/2006 | Starling et al. .......... | 338/22 R |
| 7,180,719 B2 * | 2/2007 | Whitney .................. | 361/119 |
| 7,609,143 B2 * | 10/2009 | Huang ..................... | 338/22 R |
| 2005/0062581 A1 * | 3/2005 | Koyama .................. | 338/22 R |
| 2009/0174974 A1 * | 7/2009 | Huang et al. ............ | 361/56 |

* cited by examiner

Primary Examiner—Stephen W Jackson
Assistant Examiner—Ann T Hoang
(74) Attorney, Agent, or Firm—Rosenberg, Klein & Lee

(57) ABSTRACT

An embedded type multifunctional integrated structure and a method for manufacturing the same are disclosed. The present invention utilizes the concept of multi-layer design to integrated more than two passive components on a component structure that would be adhered to a substrate. Hence, the embedded type multifunctional integrated structure has an OCP function, an OVP function, an anti-EMI function, and an anti-ESD function at the same time. Therefore, the present invention effectively integrated two or more than one passive components in order to increase function of the embedded type multifunctional integrated structure. Moreover, the present invention effectively reduces the size of the passive components on a PCB and reduces the number of solder joints.

39 Claims, 8 Drawing Sheets

EMBEDDED TYPE MULTIFUNCTIONAL INTEGRATED STRUCTURE AND METHOD FOR MANUFACTURING THE SAME

BACKGROUND OF THE INVENTION

1. Field of the Invention

The present invention relates to a multifunctional integrated structure and a method for manufacturing the same, and particularly relates to an embedded type multifunctional integrated structure and a method for manufacturing the same.

2. Description of the Related Art

For future electronic product, the electronic product design tends to achieve the functions of light, thin, short, and small. Moreover, the size of the passive components is larger than that of other electronic components in the electronic product. Hence, if the passive components can be effectively integrated together, the electronic product can achieve the functions of light, thin, short, and small easily.

However, each pass component only has a single function in the prior design. Hence, when a designer needs to use many different functions for protecting the electronic product, the designer only can place many pass components with a single function in the electronic product. Therefore, the method of the prior art wastes cost and occupies many space of the electronic product.

SUMMARY OF THE INVENTION

One particular aspect of the present invention is to provide an embedded type multifunctional integrated structure and a method for manufacturing the same. The present invention utilizes the concept of multi-layer design to integrated more than two passive components on a component structure that would be adhered to a substrate. Hence, the embedded type multifunctional integrated structure has an OCP (Over-Current Protection) function, an OVP (Over-Voltage Protection) function, an anti-EMI (anti-Electromagnetic Interference) function, and an anti-ESD (anti-Electrostatic Discharge) function at the same time. Therefore, the present invention effectively integrated two or more than one passive components in order to increase function of the embedded type multifunctional integrated structure. Moreover, the present invention effectively reduces the size of the passive components on a PCB and reduces the number of solder joints.

In order to achieve the above-mentioned aspects, the present invention provides an embedded type multifunctional integrated structure, including: a top cover insulating layer, a over-current protection layer, a middle insulating layer, a multifunctional protection layer, a bottom cover insulating layer, and a lateral conductive unit.

Moreover, the top cover insulating layer has at least one first power input portion. The over-current protection layer is disposed under the top cover insulating layer, and the over-current protection layer has a second power input portion and a second power output portion. The middle insulating layer is disposed under the over-current protection layer, and the middle insulating layer has an opening. The multifunctional protection layer is disposed under the middle insulating layer. The multifunctional protection layer has a third power input portion, a third power output portion, and a multifunctional chip unit electrically connected between the third power input portion and the third power output portion, and the multifunctional chip unit is received in the opening of the middle insulating layer. The bottom cover insulating layer is disposed under the multifunctional protection layer, and the bottom cover insulating layer has a fourth power output portion and a fifth power output portion.

Furthermore, the lateral conductive unit has a first lateral conductive layer, a second lateral conductive layer, and a third lateral conductive layer insulated from each other. Each lateral conductive layer from top to bottom is formed on lateral sides of the top cover insulating layer, the over-current protection layer, the middle insulating layer, the multifunctional protection layer, and the bottom cover insulating layer in sequence. In addition, the first power input portion and the second power input portion are electrically connected with each other via the first lateral conductive layer. The second power output portion, the third power input portion and the fourth power output portion are electrically connected with each other via the second lateral conductive layer. The third power output portion and the fifth power output portion are electrically connected with each other via the third lateral conductive layer.

In order to achieve the above-mentioned aspects, the present invention provides a method for manufacturing an embedded type multifunctional integrated structure, including: providing a top cover insulating layer that has at least one first power input portion; providing a over-current protection layer that has a second power input portion and a second power output portion; providing a middle insulating layer that has an opening; providing a multifunctional protection layer that has a third power input portion, a third power output portion, and a multifunctional chip unit electrically connected between the third power input portion and the third power output portion, and the multifunctional chip unit being received in the opening of the middle insulating layer; and providing a bottom cover insulating layer that has a fourth power output portion and a fifth power output portion.

The method further includes making the top cover insulating layer, the over-current protection layer, the middle insulating layer, the multifunctional protection layer, and the bottom cover insulating layer stacked together in sequence; and forming a first lateral conductive layer, a second lateral conductive layer, and a third lateral conductive layer that are insulated from each other. Each lateral conductive layer from top to bottom is formed on lateral sides of the top cover insulating layer, the over-current protection layer, the middle insulating layer, the multifunctional protection layer, and the bottom cover insulating layer in sequence. The first power input portion and the second power input portion are electrically connected with each other via the first lateral conductive layer. The second power output portion, the third power input portion and the fourth power output portion are electrically connected with each other via the second lateral conductive layer. The third power output portion and the fifth power output portion are electrically connected with each other via the third lateral conductive layer.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE PREFERRED EMBODIMENTS

Figure 1A:
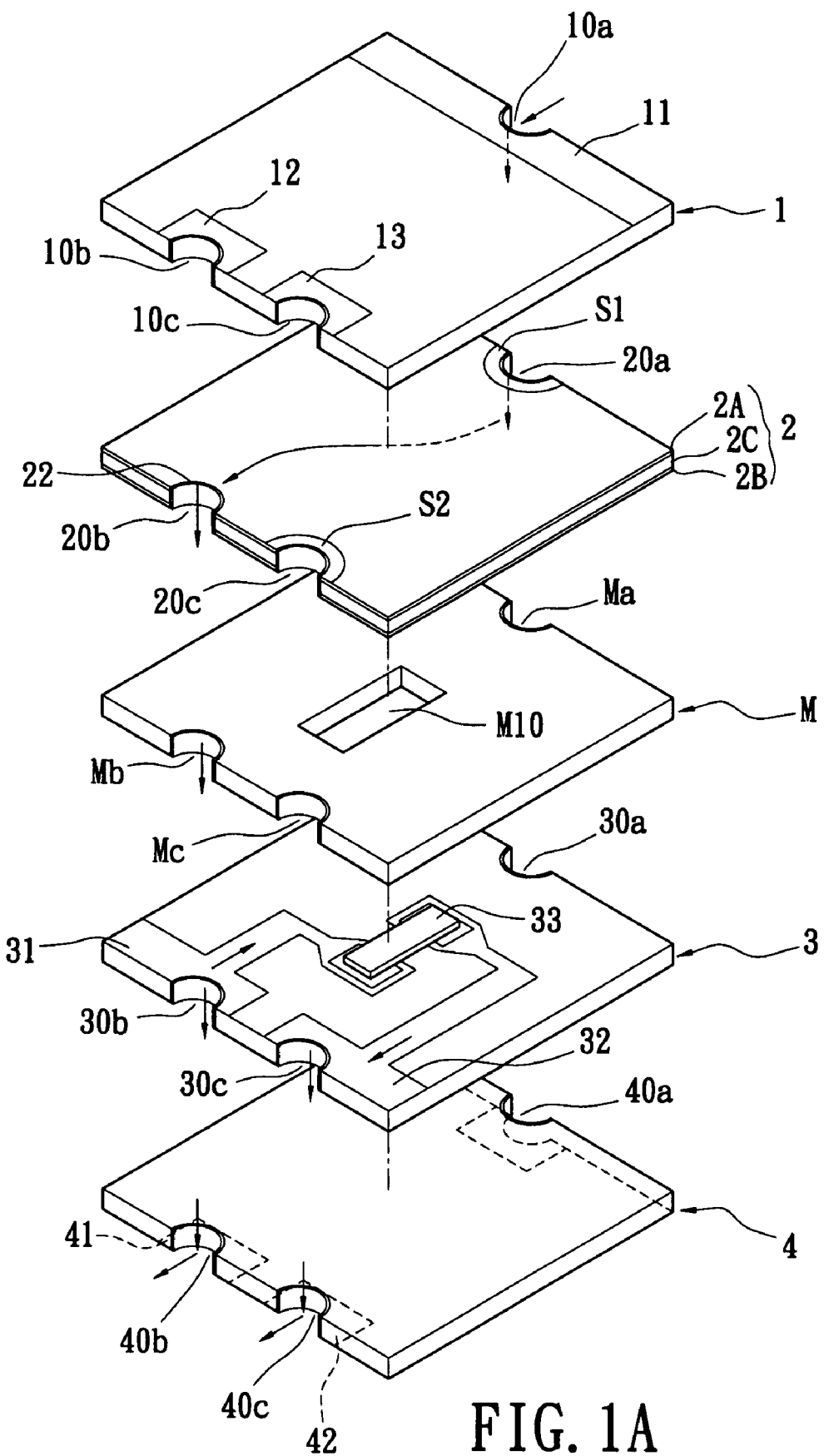
FIG. 1A is a perspective, exploded view of an embedded type multifunctional integrated structure according to the first embodiment of the present.
Figure 1B:
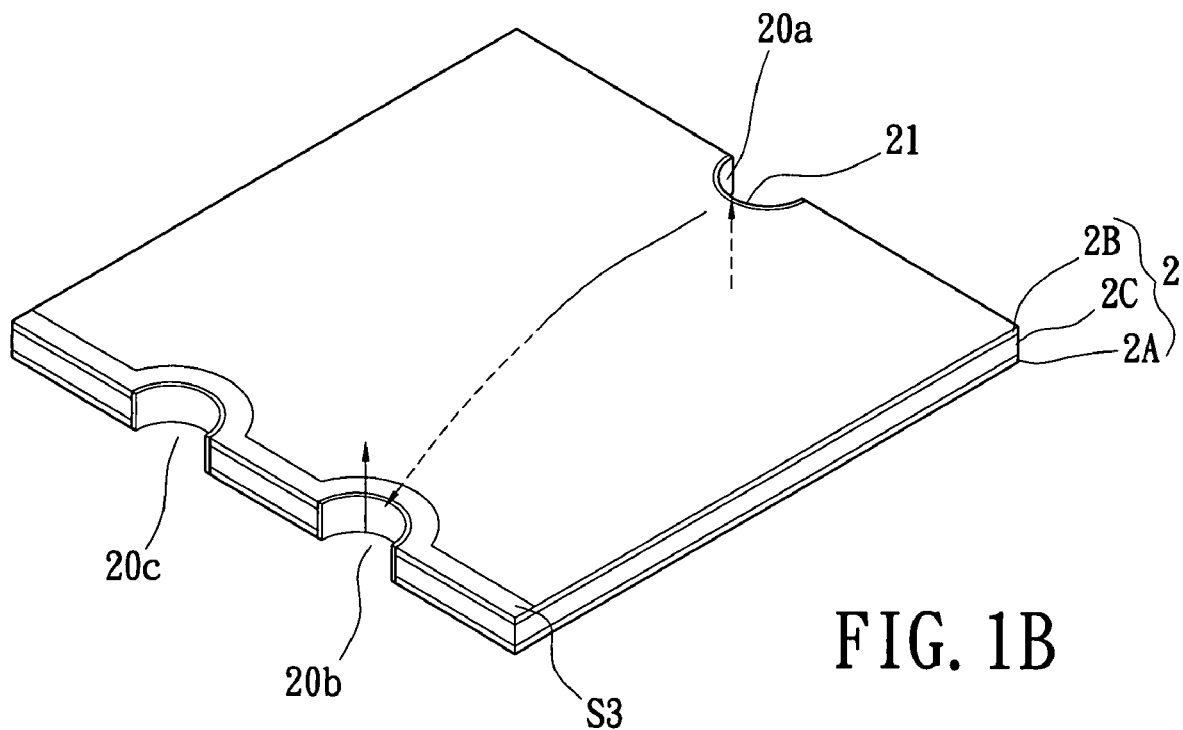
FIG. 1B is a reversed, perspective view of an over-current protection layer according to the first embodiment of the present.
Figure 1C:
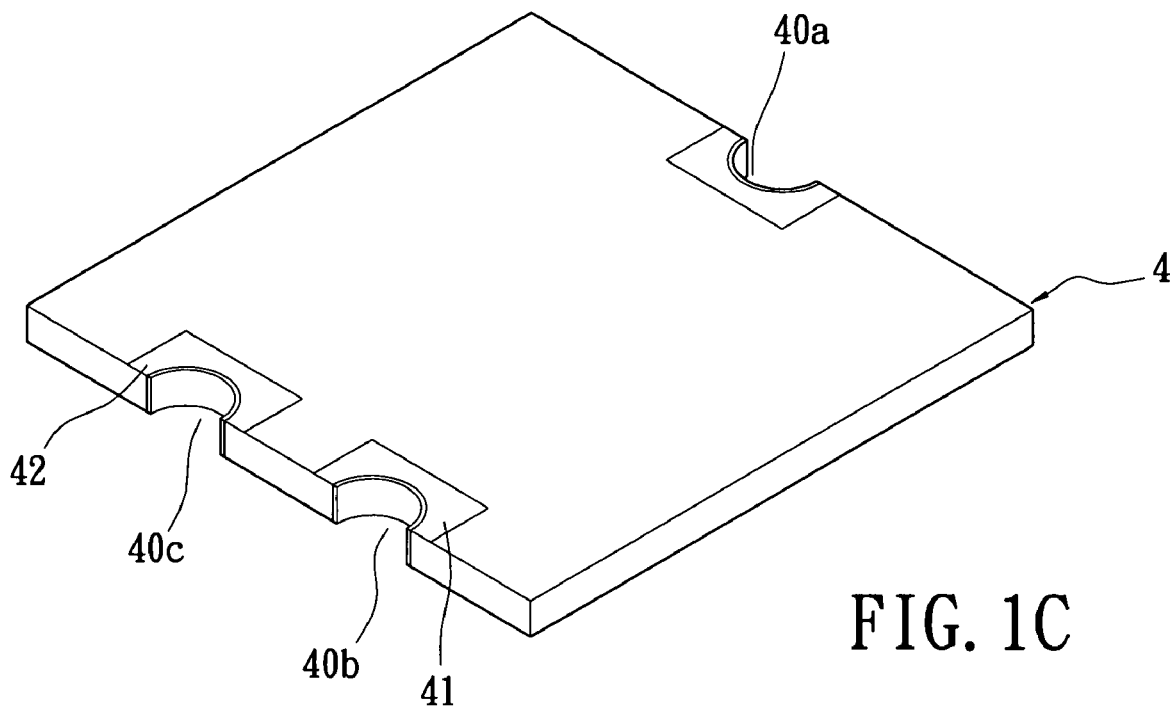
FIG. 1C is a reversed, perspective view of a bottom cover insulating layer according to the first embodiment of the present.
Figure 1D:
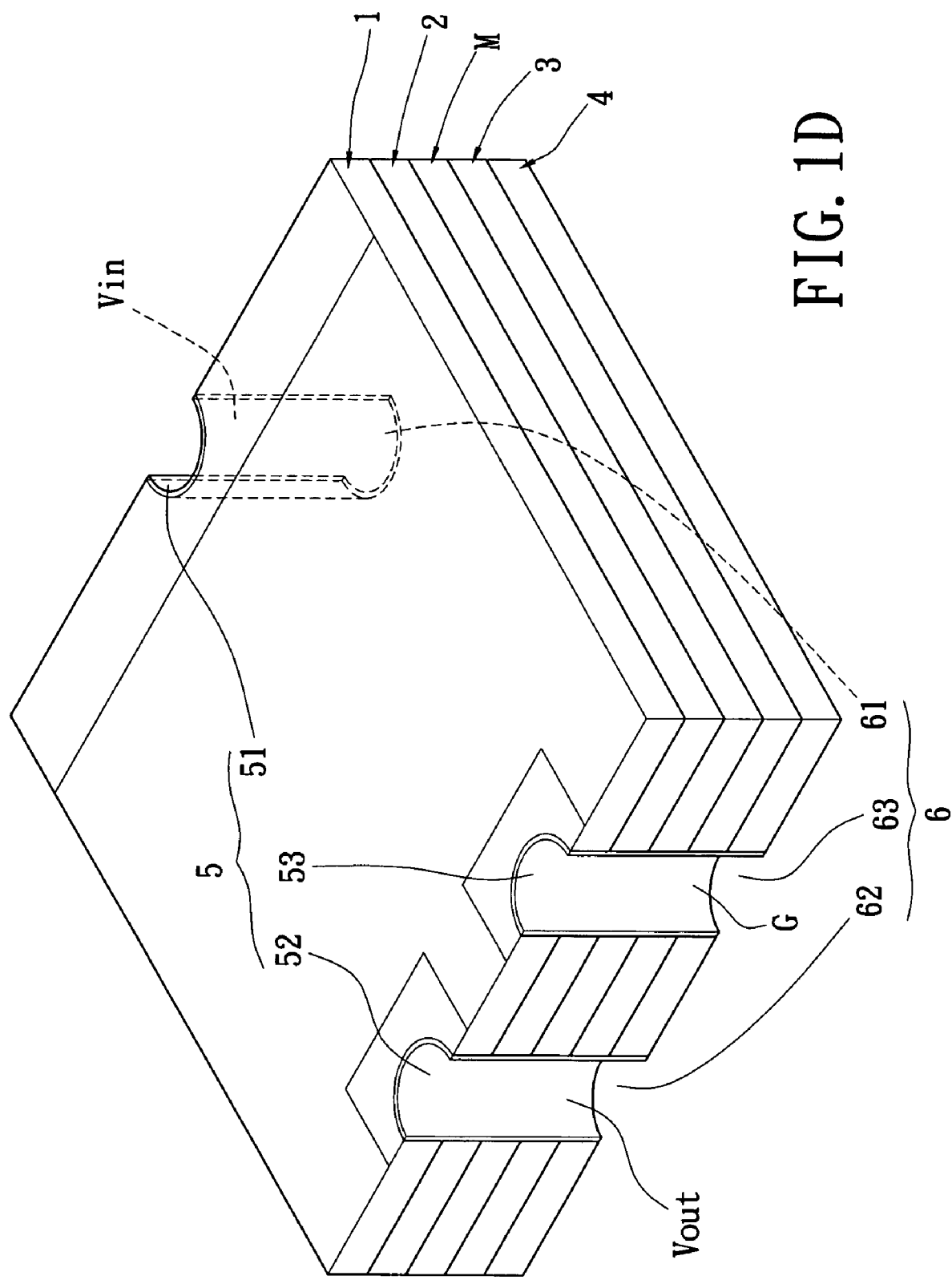
FIG. 1D is a perspective, assembled view of an embedded type multifunctional integrated structure according to the first embodiment of the present.

Referring to FIGS. 1A to 1D, FIG. 1A shows a perspective, exploded view of an embedded type multifunctional integrated structure according to the first embodiment of the present; FIG. 1B shows a reversed, perspective view of an over-current protection layer according to the first embodiment of the present; FIG. 1C shows a reversed, perspective view of a bottom cover insulating layer according to the first embodiment of the present; FIG. 1D shows a perspective, assembled view of an embedded type multifunctional integrated structure according to the first embodiment of the present.

Referring to above-mentioned figures, the first embodiment of the present invention provides an embedded type multifunctional integrated structure that includes a top cover insulating layer 1, a over-current protection layer 2, a middle insulating layer M, a multifunctional protection layer 3, a bottom cover insulating layer 4, and a lateral conductive unit 5. Moreover, the top cover insulating layer 1, the over-current protection layer 2, the middle insulating layer M, the multifunctional protection layer 3, and the bottom cover insulating layer 4 are stacked together in sequence. The lateral conductive unit 5 has a first lateral conductive layer 51, a second lateral conductive layer 52, and a third lateral conductive layer 53 insulated from each other.

In addition, the top cover insulating layer 1 has a first half hole 10a formed on a lateral side thereof, and a second half hole 10b and a third half hole 10c respectively formed on an opposite lateral side thereof. The top cover insulating layer 1 has at least one first power input portion 11 electrically connected with the first lateral conductive layer 51, at least one first power output portion 12 electrically connected with the second lateral conductive layer 52, and at least one grounding portion 13 electrically connected with the third lateral conductive layer 53. Moreover, the at least one first power input portion 11 is formed on a lateral side of a top surface of the top cover insulating layer 1, and the at least one first power output portion 12 and the at least one grounding portion 13 are formed on an opposite lateral side of the top surface of the top cover insulating layer 1.

Furthermore, the over-current protection layer 2 is disposed under the top cover insulating layer 1. The over-current protection layer 2 has a first half hole 20a formed on a lateral side thereof, and a second half hole 20b and a third half hole 20c respectively formed on an opposite lateral side thereof. In addition, the over-current protection layer 2 is composed of a first electrode layer 2A, a second electrode layer 2B, and a positive temperature coefficient material layer 2C that is disposed between the first electrode layer 2A and the second electrode layer 2B. The positive temperature coefficient material layer 2C can be a PPTC (Polymer Positive Temperature Coefficient) material layer, a resistance material layer, a capacitance material layer, or an inductance material layer.

In addition, referring to FIG. 1B, the over-current protection layer 2 has a second power input portion 21 and a second power output portion 22. The second power input portion 21 is one side of the second electrode layer 2B, and the second power output portion 22 is one side of the first electrode layer 2A. The first electrode layer 2A has a first insulating portion S1 insulated from the first lateral conductive layer 51 and a second insulating portion S2 insulated from the third lateral conductive layer 53. The second electrode layer 2B has a third insulating portion S3 insulated from the second lateral conductive layer 52 and the third lateral conductive layer 53. Hence, the first electrode layer 2A and the second electrode layer 2B are insulated from the third lateral conductive layer 53 via the second insulating portion S2 and the third insulating portion S3, respectively.

Moreover, the middle insulating layer M is disposed under the over-current protection layer 2, and the middle insulating layer M has an opening M10. The middle insulating layer M has a first half hole Ma formed on a lateral side thereof, and a second half hole Mb and a third half hole Mc respectively formed on an opposite lateral side thereof.

Furthermore, the multifunctional protection layer 3 is disposed under the middle insulating layer M. The multifunctional protection layer 3 has a first half hole 30a formed on a lateral side thereof, and a second half hole 30b and a third half hole 30c respectively formed on an opposite lateral side thereof. The multifunctional protection layer 3 has a third power input portion 31, a third power output portion 32, and a multifunctional chip unit 33 electrically connected between the third power input portion 31 and the third power output portion 32.

In addition, the multifunctional chip unit 33 is received in the opening M10 of the middle insulating layer M. In this embodiment, the third power input portion 31 and the third power output portion 32 are formed on a top surface of the multifunctional protection layer 3. Furthermore, the multifunctional chip unit 33 can be a functional chip such as an OVP (Over-Voltage Protection) chip, an anti-EMI (anti-Electromagnetic Interference) chip, or an anti-ESD (anti-Electrostatic Discharge) chip.

Moreover, the bottom cover insulating layer 4 is disposed under the multifunctional protection layer 3. The bottom cover insulating layer 4 has a first half hole 40a formed on a lateral side thereof, and a second half hole 40b and a third half hole 40c respectively formed on an opposite lateral side thereof. In addition, referring to FIG. 1C, the bottom cover insulating layer 4 has a fourth power output portion 41 and a fifth power output portion 42. The fourth power output portion 41 and the fifth power output portion 42 are formed on a bottom surface of the bottom cover insulating layer 4.

Furthermore, referring to FIG. 1D, each lateral conductive layer (51, 51 or 53) from top to bottom is formed on lateral sides of the top cover insulating layer 1, the over-current protection layer 2, the middle insulating layer M, the multi-functional protection layer 3, and the bottom cover insulating layer 4 in sequence. The first lateral conductive layer 51 is a power input side Vin, the second lateral conductive layer 52 is a power output side Vout, and the third lateral conductive layer 53 is a grounding side G.

In addition, the first half hole 10a of the top cover insulating layer 1, the first half hole 20a of the over-current protection layer 2, the first half hole Ma of the middle insulating layer M, the first half hole 30a of the multifunctional protection layer 3, and the first half hole 40a of the bottom cover insulating layer 4 are stacked together to form a first lateral penetrating groove 61. The second half hole 10b of the top cover insulating layer 1, the second half hole 20b of the over-current protection layer 2, the second half hole Mb of the middle insulating layer M, the second half hole 30b of the multifunctional protection layer 3, and the second half hole 40b of the bottom cover insulating layer 4 are stacked together to form a first lateral penetrating groove 62.

The third half hole 10c of the top cover insulating layer 1, the third half hole 20c of the over-current protection layer 2, the third half hole Mc of the middle insulating layer M, the third half hole 30c of the multifunctional protection layer 3, and the third half hole 40c of the bottom cover insulating layer 4 are stacked together to form a first lateral penetrating groove 63.

Therefore, the first lateral penetrating groove 61 is composed of the first half hole (10a, 20a, Ma, 30a, 40a) that are respectively formed on the same sides of the top cover insulating layer 1, the over-current protection layer 2, the middle insulating layer M, the multifunctional protection layer 3, and the bottom cover insulating layer 4. The second lateral penetrating groove 62 is composed of the second half hole (10b, 20b, Mb, 30b, 40b) that are respectively formed on the same opposite sides of the top cover insulating layer 1, the over-current protection layer 2, the middle insulating layer M, the multifunctional protection layer 3, and the bottom cover insulating layer 4. The third lateral penetrating groove 63 is composed of the third half hole (10c, 20c, Mc, 30c, 40c) that are respectively formed on the same opposite sides of the top cover insulating layer 1, the over-current protection layer 2, the middle insulating layer M, the multifunctional protection layer 3, and the bottom cover insulating layer 4.

Moreover, the first lateral penetrating groove 61, the second lateral penetrating groove 62, and the third lateral penetrating groove 63 separated from each other are combined to formed a lateral penetrating groove unit 6. In addition, the first lateral conductive layer 51 is formed on an inner surface of the first lateral penetrating groove 61, the second lateral conductive layer 52 is formed on an inner surface of the second lateral penetrating groove 62, and the third lateral conductive layer 53 is formed on an inner surface of the third lateral penetrating groove 63.

Hence, the first power input portion 11 and the second power input portion 21 are electrically connected with each other via the first lateral conductive layer 51. The second power output portion 22, the third power input portion 31 and the fourth power output portion 41 are electrically connected with each other via the second lateral conductive layer 52. The third power output portion 32 and the fifth power output portion 42 are electrically connected with each other via the third lateral conductive layer 53.

Referring to FIGS. 1A to 1C, the arrows mean the direction of current in the above-mentioned figures. The main path of the current in each layer from the top cover insulating layer 1 to the bottom cover insulating layer 4 is shown as follows:

First layer (the top cover insulating layer 1): The current flows from the first power input portion 11 of the top cover insulating layer 1 to the second power input portion 21 via the first lateral conductive layer 51.

Second layer (the over-current protection layer 2): The current flows through the second electrode layer 2B, the positive temperature coefficient material layer 2C, and the first electrode layer 2A in sequence and flows from the second power input portion 21 to the second power output portion 22. Hence, the present invention has the function of OCP (Over-Current Protection) due to the material property of the positive temperature coefficient material layer 2C.

Third layer (the middle insulating layer M): The current flows from the second power output portion 22 to the third power input portion 31 of the multifunctional protection layer 3 via the second lateral conductive layer 52.

Fourth layer (the multifunctional protection layer 3): The flowing direction of the current is determined according to the setting of the multifunctional chip unit 33. Hence, the normal current flows to next layer directly. The abnormal current flows from the third power input portion 31 to the third power output portion 32 through the multifunctional chip unit 33. For example, the multifunctional chip unit 33 is an OVP (Over-Voltage Protection) chip and the voltage load of the OVP chip is 5 volt. Hence, when the current is smaller than 5 volt, the current is outputted normally; when the current is larger than 5 volt, the current is transmitted to the grounding side through the OVP chip.

Fifth layer (the bottom cover insulating layer 4): The normal current flows from the third power input portion 31 to the fourth power output portion 41 of the bottom cover insulating layer 4 via the second lateral conductive layer 52. The abnormal current flows from the third power output portion 32 to the fifth power output portion 42 of the bottom cover insulating layer 4, and then is transmitted to the grounding side.

Figure 2A:
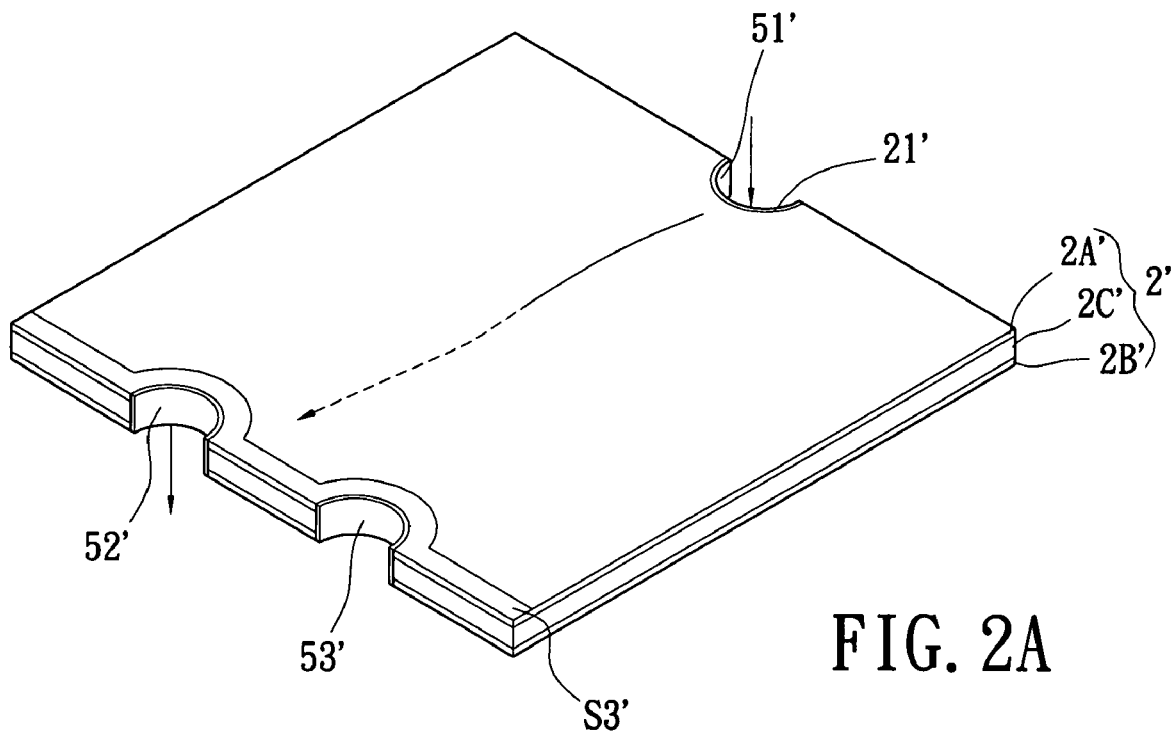
FIG. 2A is a perspective view of an over-current protection layer according to the second embodiment of the present.
Figure 2B:
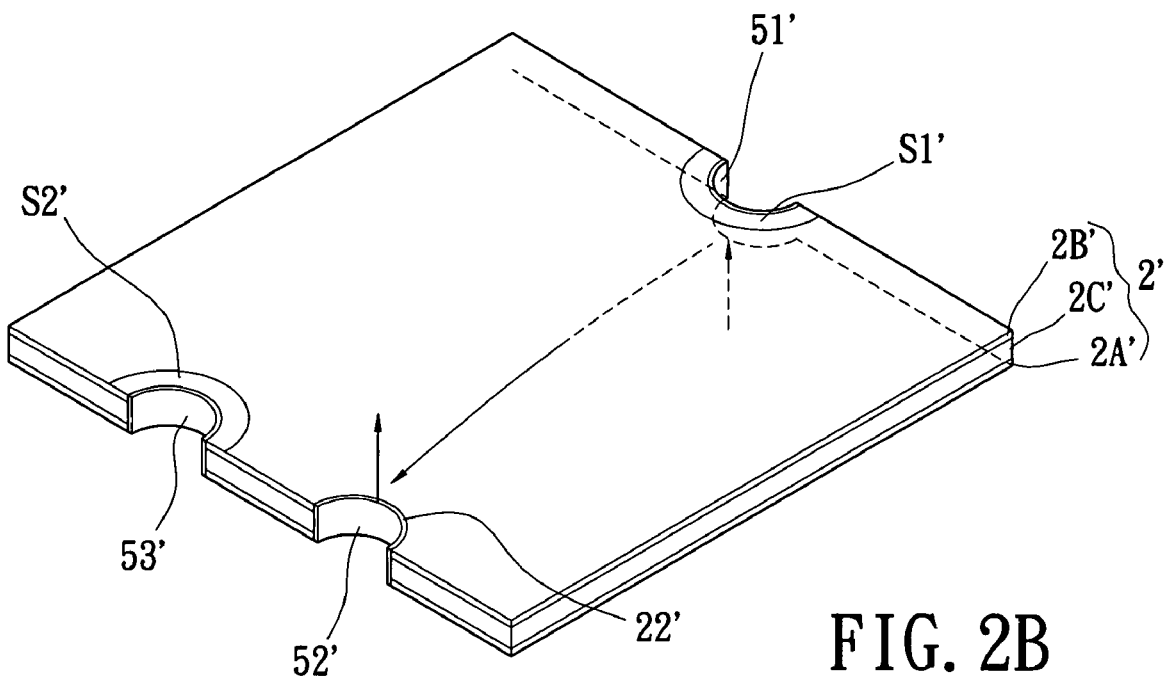
FIG. 2B is a reversed, perspective view of an over-current protection layer according to the second embodiment of the present.

Referring to FIGS. 2A and 2B, FIG. 2A shows a perspective view of an over-current protection layer according to the second embodiment of the present; FIG. 2B shows a reversed, perspective view of an over-current protection layer according to the second embodiment of the present.

Referring to the above-mentioned figures, the second power input portion 21' is one side of the first electrode layer 2A', and the second power output portion 22' is one side of the second electrode layer 2B'. The first electrode layer 2A' has third insulating portion S3' insulated from the second lateral conductive layer 52' and the third lateral conductive layer 53'. The second electrode layer 2B' has a first insulating portion S1' insulated from the first lateral conductive layer 51' and a second insulating portion S2' insulated from the third lateral conductive layer 53'. Hence, the first electrode layer 2A' and the second electrode layer 2B' are insulated from the third lateral conductive layer 53' via the third insulating portion S3' and the second insulating portion S2', respectively.

Therefore, the current path of second layer (the over-current protection layer 2') of the second embodiment is that the current flows through the first electrode layer 2A', the positive temperature coefficient material layer 2C', and the second electrode layer 2B' in sequence and flows from the second power input portion 21' to the second power output portion 22'.

Figure 3A:
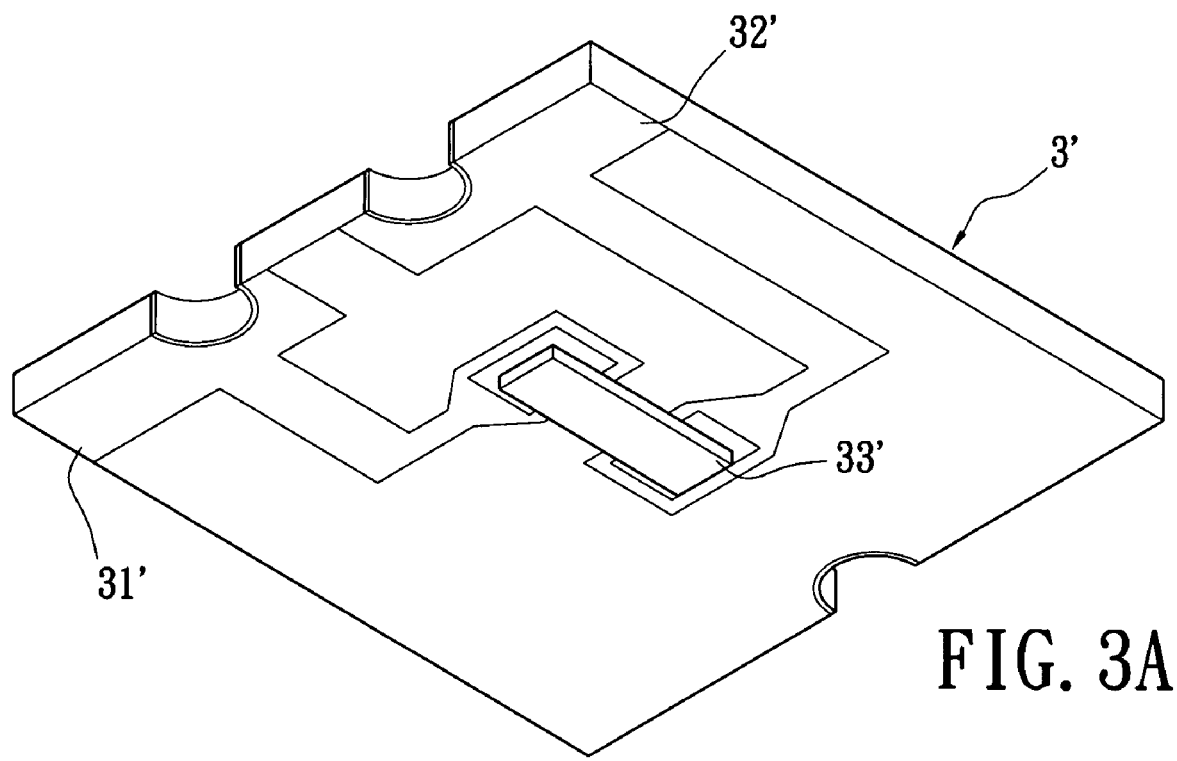
FIG. 3A is a perspective view of a multifunctional protection layer according to the third embodiment of the present.
Figure 3B:
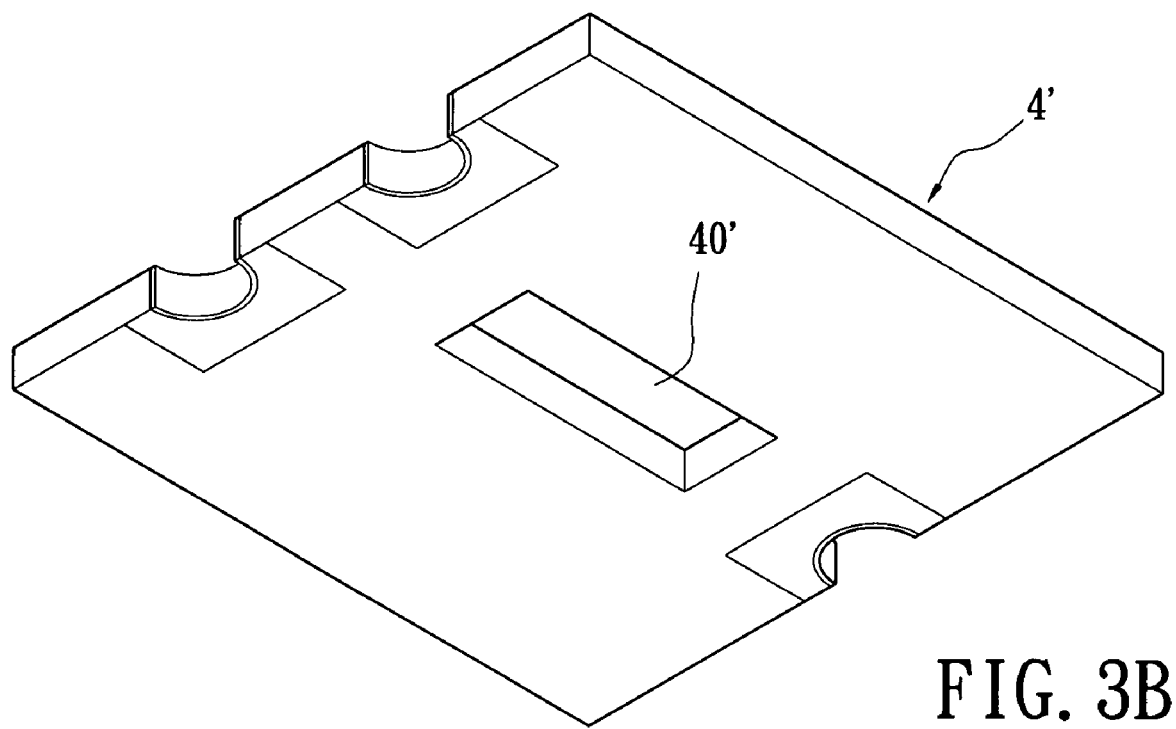
FIG. 3B is a reversed, perspective view of a multifunctional protection layer according to the third embodiment of the present.

Referring to FIGS. 3A and 3B, FIG. 3A shows a perspective view of a multifunctional protection layer according to the third embodiment of the present; FIG. 3B shows a reversed, perspective view of a multifunctional protection layer according to the third embodiment of the present. The third power input portion 31', the third power output portion 32', and the multifunctional chip unit 33' are formed on a bottom surface of the multifunctional protection layer 3'. In addition, the bottom cover insulating layer 4' has an opening 40' for receiving the multifunctional chip unit 33'.

Furthermore, the present invention can combine the first embodiment and the third embodiment, so the third power input portion 31, the third power output portion 32, and the multifunctional chip unit 33 are formed on the top surface of the multifunctional protection layer 3 (as shown in the first embodiment), and the third power input portion 31', the third power output portion 32', and the multifunctional chip unit 33' are formed on the bottom surface of the multifunctional protection layer 3' (as shown in the third embodiment). In other words, the two third power input portions can be respectively formed on a top surface and a bottom surface of the multifunctional protection layer, and the two third power output portions can be respectively formed on a top surface and a bottom surface of the multifunctional protection layer.

Figure 4A:
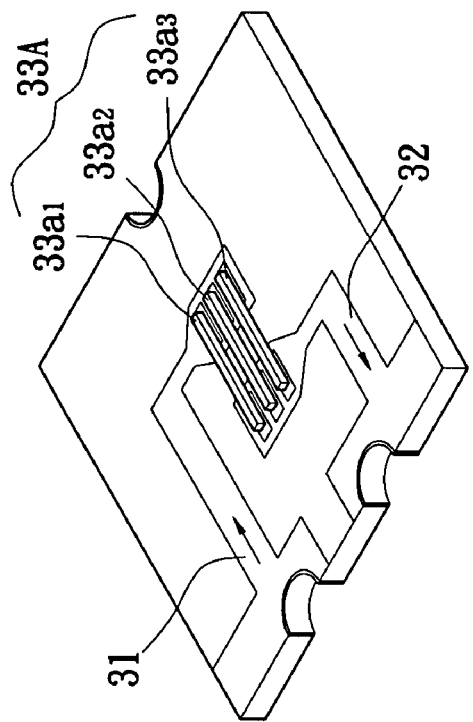
FIG. 4A is a perspective view of a first arrangement of a multifunctional chip unit according to the present.

FIG. 4A is a perspective view of a first arrangement of a multifunctional chip unit according to the present. The multifunctional chip unit 33A is composed of a plurality of functional chips ($33a_1$, $33a_2$, $33a_3$) such as an OVP (Over-Voltage Protection) chip, an anti-EMI (anti-Electromagnetic Interference) chip, and an anti-ESD (anti-Electrostatic Discharge) chip. Moreover, the functional chips ($33a_1$, $33a_2$, $33a_3$) are parallelly and electrically connected between the third power input portion 31 and the third power output portion 32.

Figure 4C:
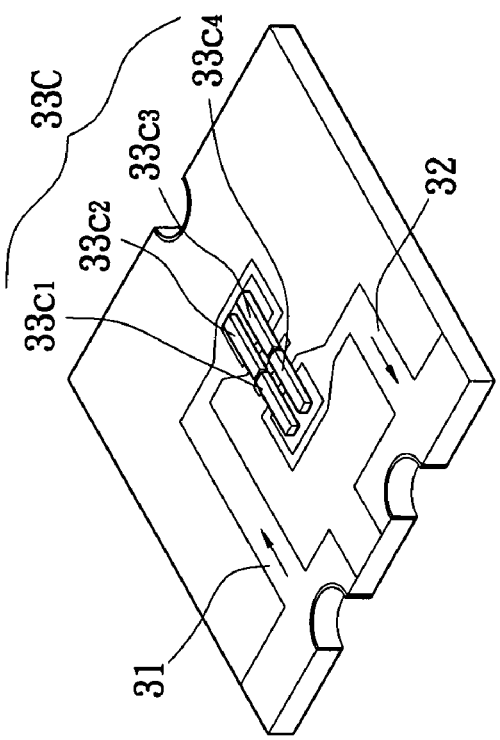
FIG. 4C is a perspective view of a third arrangement of a multifunctional chip unit according to the present.
Figure 4B:
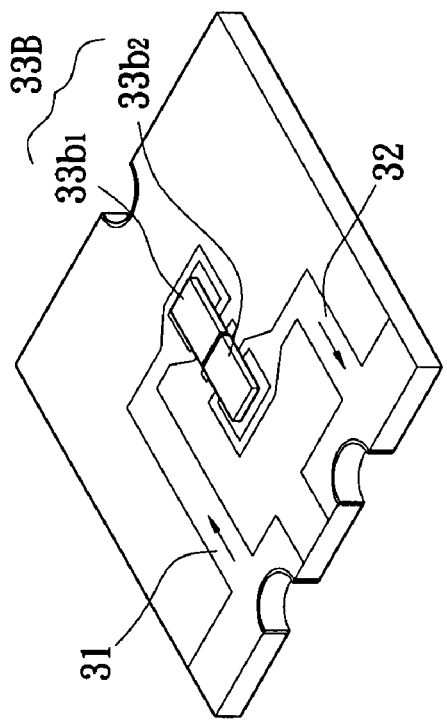
FIG. 4B is a perspective view of a second arrangement of a multifunctional chip unit according to the present.

FIG. 4B shows a perspective view of a second arrangement of a multifunctional chip unit according to the present. The multifunctional chip unit 33B is composed of a plurality of functional chips ($33b_1$, $33b_2$) that can be any selected from the group consisting of an OVP (Over-Voltage Protection) chip, an anti-EMI (anti-Electromagnetic Interference) chip, and an anti-ESD (anti-Electrostatic Discharge) chip. Moreover, the functional chips ($33b_1$, $33b_2$) are seriesly and electrically connected between the third power input portion 31 and the third power output portion 32.

FIG. 4C shows a perspective view of a third arrangement of a multifunctional chip unit according to the present. The multifunctional chip unit 33C is composed of a plurality of functional chips ($33c_1$, $33c_2$, $33c_3$, $33c_4$) that can be any selected from the group consisting of an OVP (Over-Voltage Protection) chip, an anti-EMI (anti-Electromagnetic Interference) chip, and an anti-ESD (anti-Electrostatic Discharge) chip. Moreover, the functional chips ($33c_1$, $33c_2$, $33c_3$, $33c_4$) are parallelly, seriesly and electrically connected between the third power input portion 31 and the third power output portion 32.

Figure 5:
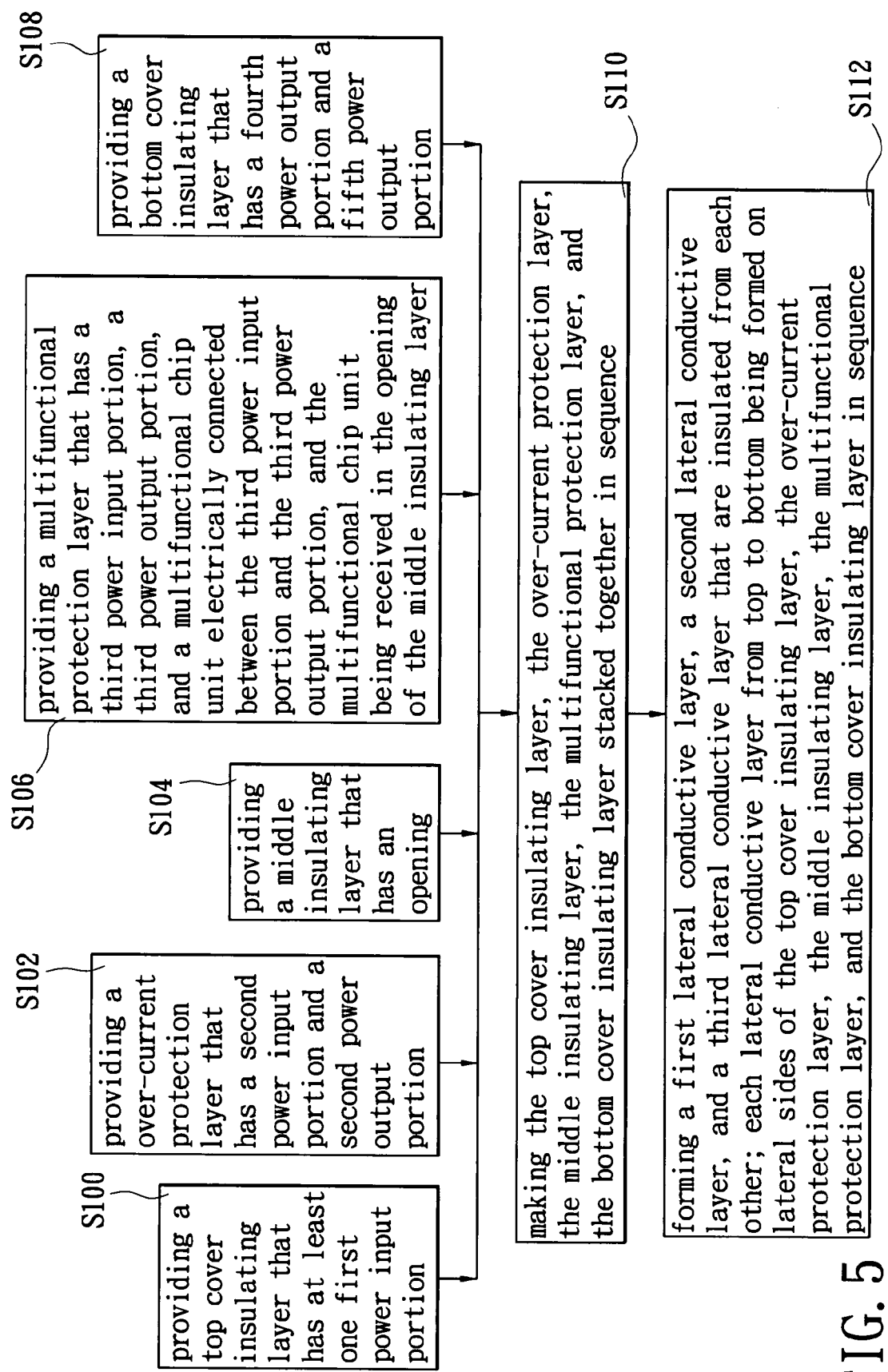
FIG. 5 is a flowchart of a method for manufacturing an embedded type multifunctional integrated structure according to the present.

FIG. 5 shows a flowchart of a method for manufacturing an embedded type multifunctional integrated structure according to the present. The method for manufacturing the embedded type multifunctional integrated structure includes:

Step S100 is providing a top cover insulating layer that has at least one first power input portion.

Step S102 is providing a over-current protection layer that has a second power input portion and a second power output portion;

Step S104 is providing a middle insulating layer that has an opening;

Step S106 is providing a multifunctional protection layer that has a third power input portion, a third power output portion, and a multifunctional chip unit electrically connected between the third power input portion and the third power output portion, and the multifunctional chip unit being received in the opening of the middle insulating layer;

Step S108 is providing a bottom cover insulating layer that has a fourth power output portion and a fifth power output portion;

Step S110 is making the top cover insulating layer, the over-current protection layer, the middle insulating layer, the multifunctional protection layer, and the bottom cover insulating layer stacked together in sequence; and Step S112 is forming a first lateral conductive layer, a second lateral conductive layer, and a third lateral conductive layer that are insulated from each other; each lateral conductive layer from top to bottom being formed on lateral sides of the top cover insulating layer, the over-current protection layer, the middle insulating layer, the multifunctional protection layer, and the bottom cover insulating layer in sequence. Therefore, the first power input portion and the second power input portion is electrically connected with each other via the first lateral conductive layer; the second power output portion, the third power input portion and the fourth power output portion is electrically connected with each other via the second lateral conductive layer; the third power output portion and the fifth power output portion is electrically connected with each other via the third lateral conductive layer.

Moreover, before the step of forming the three lateral conductive layers (S112), the method further comprising forming a first lateral penetrating groove, a second lateral penetrating groove, and a third lateral penetrating groove that are separated from each other. Each lateral penetrating groove is formed via drilling or punching the top cover insulating layer, the over-current protection layer, the middle insulating layer, the multifunctional protection layer, and the bottom cover insulating layer in sequence. The first lateral conductive layer is formed on an inner surface of the first lateral penetrating groove, the second lateral conductive layer is formed on an inner surface of the second lateral penetrating groove, and the third lateral conductive layer is formed on an inner surface of the third lateral penetrating groove.

Figure 6:
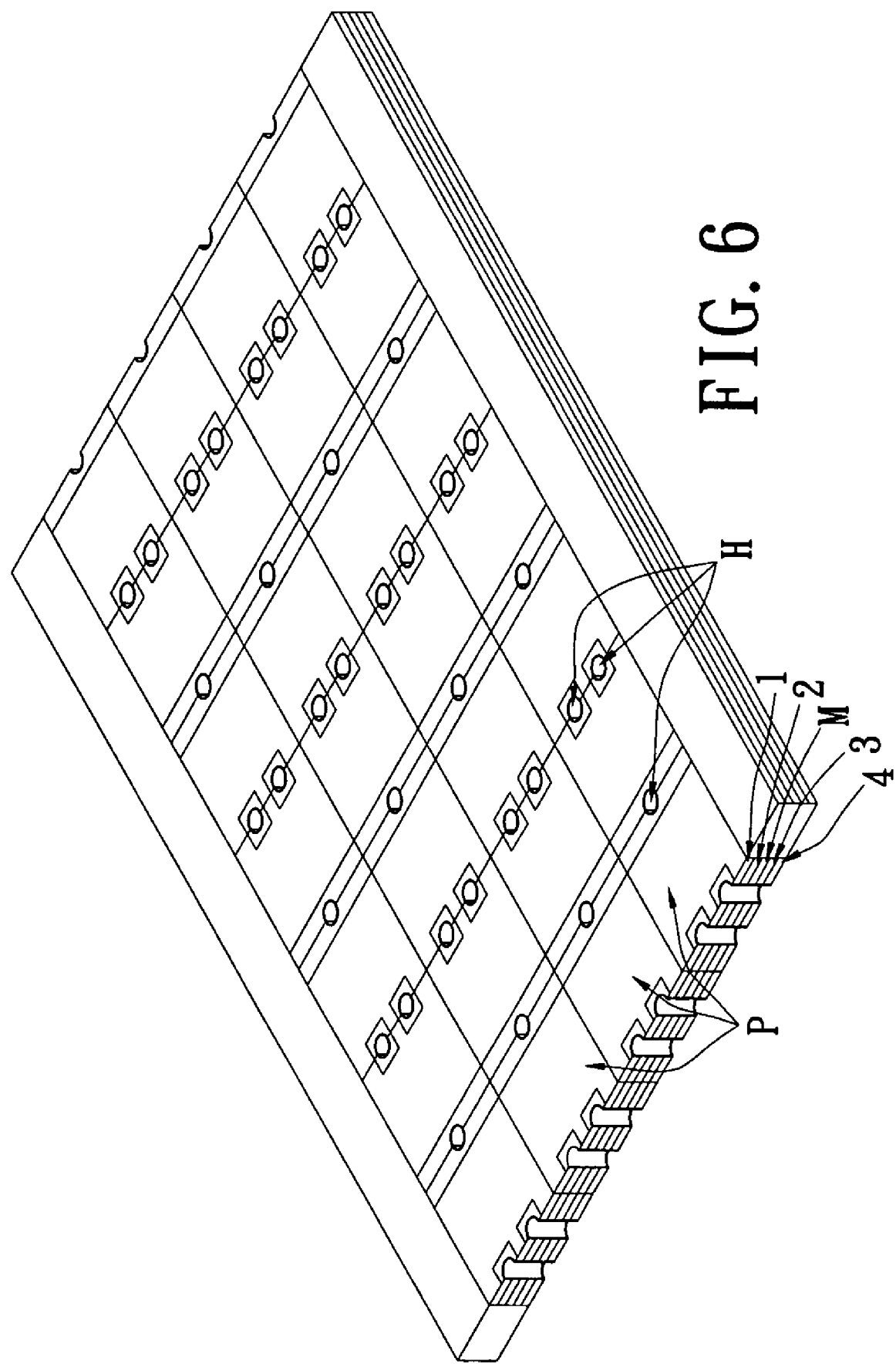
FIG. 6 is a perspective view of a stacked structure with five layers according to the present invention (before many embedded type multifunctional integrated structure are cut from the stacked structure).

FIG. 6 shows a perspective view of a stacked structure with five layers according to the present invention (before many embedded type multifunctional integrated structure are cut from the stacked structure). Each top cover insulating layer 1, each over-current protection layer 2, each middle insulating layer M, each multifunctional protection layer 3, and each bottom cover insulating layer 4 are drilled or punched in sequence to form a plurality of penetrating holes H. Many conductive layers from top to bottom are respectively coated on inner surfaces of the penetrating holes H of each top cover insulating layer 1, each over-current protection layer 2, each middle insulating layer M, each multifunctional protection layer 3, and each bottom cover insulating layer 4. Finally, each embedded type multifunctional integrated structure P (as shown in FIG. 1D) is cut from the stacked structure. Hence, the present invention can manufacture many embedded type multifunctional integrated structure P at the same time.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An embedded type multifunctional integrated structure, comprising:
    a top cover insulating layer having at least one first power input portion;
    a over-current protection layer disposed under the top cover insulating layer, wherein the over-current protection layer has a second power input portion and a second power output portion;
    a middle insulating layer disposed under the over-current protection layer, wherein the middle insulating layer has an opening;
    a multifunctional protection layer disposed under the middle insulating layer, wherein the multifunctional protection layer has a third power input portion, a third power output portion, and a multifunctional chip unit electrically connected between the third power input portion and the third power output portion, and the multifunctional chip unit is received in the opening of the middle insulating layer;
    a bottom cover insulating layer disposed under the multifunctional protection layer, wherein the bottom cover insulating layer has a fourth power output portion and a fifth power output portion; and
    a lateral conductive unit having a first lateral conductive layer, a second lateral conductive layer, and a third lateral conductive layer insulated from each other, wherein each lateral conductive layer from top to bottom is formed on lateral sides of the top cover insulating layer, the over-current protection layer, the middle insulating layer, the multifunctional protection layer, and the bottom cover insulating layer in sequence;
    wherein the first power input portion and the second power input portion are electrically connected with each other via the first lateral conductive layer;
    the second power output portion, the third power input portion and the fourth power output portion are electrically connected with each other via the second lateral conductive layer; the third power output portion and the fifth power output portion are electrically connected with each other via the third lateral conductive layer.

2. The embedded type multifunctional integrated structure as claimed in claim 1, further comprising a lateral penetrating groove unit that has a first lateral penetrating groove, a second lateral penetrating groove, and a third lateral penetrating groove separated from each other, wherein the first lateral conductive layer is formed on an inner surface of the first lateral penetrating groove, the second lateral conductive layer is formed on an inner surface of the second lateral penetrating groove, and the third lateral conductive layer is formed on an inner surface of the third lateral penetrating groove.

3. The embedded type multifunctional integrated structure as claimed in claim 2, wherein the first lateral penetrating groove is composed of a plurality of first half hole respectively formed on the same sides of the top cover insulating layer, the over-current protection layer, the middle insulating layer, the multifunctional protection layer, and the bottom cover insulating layer; wherein the second lateral penetrating groove is composed of a plurality of second half hole respectively formed on the same opposite sides of the top cover insulating layer, the over-current protection layer, the middle insulating layer, the multifunctional protection layer, and the bottom cover insulating layer; wherein the third lateral penetrating groove is composed of a plurality of third half hole respectively formed on the same opposite sides of the top cover insulating layer, the over-current protection layer, the middle insulating layer, the multifunctional protection layer, and the bottom cover insulating layer.

4. The embedded type multifunctional integrated structure as claimed in claim 1, wherein the top cover insulating layer has at least one first power output portion electrically connected with the second lateral conductive layer and at least one grounding portion electrically connected with the third lateral conductive layer; wherein the at least one first power input portion is formed on a lateral side of a top surface of the top cover insulating layer, and the at least one first power output portion and the at least one grounding portion are formed on an opposite lateral side of the top surface of the top cover insulating layer.

5. The embedded type multifunctional integrated structure as claimed in claim 1, wherein the over-current protection layer is composed of a first electrode layer, a second electrode layer, and a positive temperature coefficient material layer that is disposed between the first electrode layer and the second electrode layer.

6. The embedded type multifunctional integrated structure as claimed in claim 5, wherein the positive temperature coefficient material layer is a PPTC (Polymer Positive Temperature Coefficient) material layer, a resistance material layer, a capacitance material layer, or an inductance material layer.

7. The embedded type multifunctional integrated structure as claimed in claim 5, wherein the second power input portion is one side of the second electrode layer, and the second power output portion is one side of the first electrode layer; wherein the first electrode layer has a first insulating portion insulated from the first lateral conductive layer and a second insulating portion insulated from the third lateral conductive layer, and the second electrode layer has a third insulating portion insulated from the second lateral conductive layer and the third lateral conductive layer, so the first electrode layer and the second electrode layer are insulated from the third lateral conductive layer via the second insulating portion and the third insulating portion, respectively.

8. The embedded type multifunctional integrated structure as claimed in claim 5, wherein the second power input portion is one side of the first electrode layer, and the second power output portion is one side of the second electrode layer; wherein the first electrode layer has third insulating portion insulated from the second lateral conductive layer and the third lateral conductive layer, and the second electrode layer has a first insulating portion insulated from the first lateral conductive layer and a second insulating portion insulated from the third lateral conductive layer, so the first electrode layer and the second electrode layer are insulated from the third lateral conductive layer via the third insulating portion and the second insulating portion, respectively.

9. The embedded type multifunctional integrated structure as claimed in claim 1, wherein the third power input portion and the third power output portion are formed on a top surface of the multifunctional protection layer.

10. The embedded type multifunctional integrated structure as claimed in claim 1, wherein the third power input portion and the third power output portion are formed on a bottom surface of the multifunctional protection layer.

11. The embedded type multifunctional integrated structure as claimed in claim 1, wherein the third power input portion is formed on a top surface and a bottom surface of the multifunctional protection layer, and the third power output portion is formed on a top surface and a bottom surface of the multifunctional protection layer.

12. The embedded type multifunctional integrated structure as claimed in claim 1, wherein the multifunctional chip unit is a functional chip.

13. The embedded type multifunctional integrated structure as claimed in claim 12, wherein the functional chip is an OVP (Over-Voltage Protection) chip, an anti-EMI (anti-Electromagnetic Interference) chip, or an anti-ESD (anti-Electrostatic Discharge) chip.

14. The embedded type multifunctional integrated structure as claimed in claim 1, wherein the multifunctional chip unit is composed of a plurality of functional chips.

15. The embedded type multifunctional integrated structure as claimed in claim 14, wherein the functional chips are an OVP (Over-Voltage Protection) chip, an anti-EMI (anti-Electromagnetic Interference) chip, and an anti-ESD (anti-Electrostatic Discharge) chip.

16. The embedded type multifunctional integrated structure as claimed in claim 14, wherein the functional chips are parallelly and electrically connected between the third power input portion and the third power output portion.

17. The embedded type multifunctional integrated structure as claimed in claim 14, wherein the functional chips are seriesly and electrically connected between the third power input portion and the third power output portion.

18. The embedded type multifunctional integrated structure as claimed in claim 14, wherein the functional chips are parallelly, seriesly and electrically connected between the third power input portion and the third power output portion.

19. The embedded type multifunctional integrated structure as claimed in claim 1, wherein the fourth power output portion and the fifth power output portion are formed on a bottom surface of the bottom cover insulating layer.

20. The embedded type multifunctional integrated structure as claimed in claim 1, wherein the top cover insulating layer, the over-current protection layer, the middle insulating layer, the multifunctional protection layer, and the bottom cover insulating layer are stacked together in sequence.

21. A method for manufacturing an embedded type multifunctional integrated structure, comprising:
providing a top cover insulating layer that has at least one first power input portion;
providing a over-current protection layer that has a second power input portion and a second power output portion;
providing a middle insulating layer that has an opening;
providing a multifunctional protection layer that has a third power input portion, a third power output portion, and a multifunctional chip unit electrically connected between the third power input portion and the third power output portion, wherein the multifunctional chip unit is received in the opening of the middle insulating layer;
providing a bottom cover insulating layer that has a fourth power output portion and a fifth power output portion;
making the top cover insulating layer, the over-current protection layer, the middle insulating layer, the multifunctional protection layer, and the bottom cover insulating layer stacked together in sequence; and
forming a first lateral conductive layer, a second lateral conductive layer, and a third lateral conductive layer that are insulated from each other; wherein each lateral conductive layer from top to bottom is formed on lateral sides of the top cover insulating layer, the over-current protection layer, the middle insulating layer, the multifunctional protection layer, and the bottom cover insulating layer in sequence; wherein the first power input portion and the second power input portion are electrically connected with each other via the first lateral conductive layer; the second power output portion, the third power input portion and the fourth power output portion are electrically connected with each other via the second lateral conductive layer; the third power output portion and the fifth power output portion are electrically connected with each other via the third lateral conductive layer.

22. The method as claimed in claim 21, wherein before the step of forming the three lateral conductive layers, the method further comprising forming a first lateral penetrating groove, a second lateral penetrating groove, and a third lateral penetrating groove that are separated from each other; wherein each lateral penetrating groove is formed via drilling or punching the top cover insulating layer, the over-current protection layer, the middle insulating layer, the multifunctional protection layer, and the bottom cover insulating layer in sequence; wherein the first lateral conductive layer is formed on an inner surface of the first lateral penetrating groove, the second lateral conductive layer is formed on an inner surface of the second lateral penetrating groove, and the third lateral conductive layer is formed on an inner surface of the third lateral penetrating groove.

23. The method as claimed in claim 22, wherein the first lateral penetrating groove is composed of a plurality of first half hole respectively formed on the same sides of the top cover insulating layer, the over-current protection layer, the middle insulating layer, the multifunctional protection layer, and the bottom cover insulating layer; wherein the second lateral penetrating groove is composed of a plurality of second half hole respectively formed on the same opposite sides of the top cover insulating layer, the over-current protection layer, the middle insulating layer, the multifunctional protection layer, and the bottom cover insulating layer; wherein the third lateral penetrating groove is composed of a plurality of third half hole respectively formed on the same opposite sides of the top cover insulating layer, the over-current protection layer, the middle insulating layer, the multifunctional protection layer, and the bottom cover insulating layer.

24. The method as claimed in claim 21, wherein the top cover insulating layer has at least one first power output portion electrically connected with the second lateral conductive layer and at least one grounding portion electrically connected with the third lateral conductive layer; wherein the at least one first power input portion is formed on a lateral side of a top surface of the top cover insulating layer, and the at least one first power output portion and the at least one grounding portion are formed on an opposite lateral side of the top surface of the top cover insulating layer.

25. The method as claimed in claim 21, wherein the over-current protection layer is composed of a first electrode layer, a second electrode layer, and a positive temperature coefficient material layer that is disposed between the first electrode layer and the second electrode layer.

26. The method as claimed in claim 25, wherein the positive temperature coefficient material layer is a PPTC (Polymer Positive Temperature Coefficient) material layer, a resistance material layer, a capacitance material layer, or an inductance material layer.

27. The method as claimed in claim 25, wherein the second power input portion is one side of the second electrode layer, and the second power output portion is one side of the first electrode layer; wherein the first electrode layer has a first insulating portion insulated from the first lateral conductive layer and a second insulating portion insulated from the third lateral conductive layer, and the second electrode layer has a third insulating portion insulated from the second lateral conductive layer and the third lateral conductive layer, so the first electrode layer and the second electrode layer are insulated from the third lateral conductive layer via the second insulating portion and the third insulating portion, respectively.

28. The method as claimed in claim 25, wherein the second power input portion is one side of the first electrode layer, and the second power output portion is one side of the second electrode layer; wherein the first electrode layer has third insulating portion insulated from the second lateral conductive layer and the third lateral conductive layer, and the second electrode layer has a first insulating portion insulated from the first lateral conductive layer and a second insulating portion insulated from the third lateral conductive layer, so the first electrode layer and the second electrode layer are insulated from the third lateral conductive layer via the third insulating portion and the second insulating portion, respectively.

29. The method as claimed in claim 21, wherein the third power input portion and the third power output portion are formed on a top surface of the multifunctional protection layer.

30. The method as claimed in claim 21, wherein the third power input portion and the third power output portion are formed on a bottom surface of the multifunctional protection layer.

31. The method as claimed in claim 21, wherein the third power input portion is formed on a top surface and a bottom surface of the multifunctional protection layer, and the third power output portion is formed on a top surface and a bottom surface of the multifunctional protection layer.

32. The method as claimed in claim 21, wherein the multifunctional chip unit is a functional chip.

33. The method as claimed in claim 32, wherein the functional chip is an OVP (Over-Voltage Protection) chip, an anti-EMI (anti-Electromagnetic Interference) chip, or an anti-ESD (anti-Electrostatic Discharge) chip.

34. The method as claimed in claim 21, wherein the multifunctional chip unit is composed of a plurality of functional chips.

35. The method as claimed in claim 34, wherein the functional chips are an OVP (Over-Voltage Protection) chip, an anti-EMI (anti-Electromagnetic Interference) chip, and an anti-ESD (anti-Electrostatic Discharge) chip.

36. The method as claimed in claim 34, wherein the functional chips are parallelly and electrically connected between the third power input portion and the third power output portion.

37. The method as claimed in claim 34, wherein the functional chips are seriesly and electrically connected between the third power input portion and the third power output portion.

38. The method as claimed in claim 34, wherein the functional chips are parallelly, seriesly and electrically connected between the third power input portion and the third power output portion.

39. The method as claimed in claim 21, wherein the fourth power output portion and the fifth power output portion are formed on a bottom surface of the bottom cover insulating layer.

* * * * *